(12) United States Patent
Arakawa et al.

(10) Patent No.: US 8,210,658 B2
(45) Date of Patent: Jul. 3, 2012

(54) PIEZOELECTRIC MATERIAL, METHOD FOR PRODUCING PIEZOELECTRIC MATERIAL, PIEZOELECTRIC DEVICE AND LIQUID DISCHARGE DEVICE

(75) Inventors: Takami Arakawa, Kanagawa-ken (JP); Yuichi Okamoto, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 337 days.

(21) Appl. No.: 12/699,589

(22) Filed: Feb. 3, 2010

(65) Prior Publication Data
US 2010/0253749 A1 Oct. 7, 2010

(30) Foreign Application Priority Data
Feb. 4, 2009 (JP) .................... 023595/2009

(51) Int. Cl.
*B41J 2/045* (2006.01)
*H01L 41/08* (2006.01)
*H01L 41/187* (2006.01)
(52) U.S. Cl. .................... 347/68; 310/358; 252/62.9 PZ
(58) Field of Classification Search .................... 347/68; 310/358; 252/62.9 PZ
See application file for complete search history.

(56) References Cited

U.S. PATENT DOCUMENTS

| | | | |
|---|---|---|---|
| 7,048,360 B2 * | 5/2006 | Kanno et al. ................ | 347/68 |
| 2009/0058955 A1 * | 3/2009 | Arakawa et al. ........... | 347/68 |

FOREIGN PATENT DOCUMENTS

| | | | |
|---|---|---|---|
| EP | 1973177 A2 * | 9/2008 | |
| JP | 2003-243741 A | 8/2003 | |

OTHER PUBLICATIONS

Matsunaga et al., "Structural Investigation of $Pb_y(Zr_{0.57}Ti_{0.43})2-_yO_3$ films deposited on Pt(001)/MgO(001) substrates by rf sputtering", Physical Review B, vol. 66, Aug. 6, 2002, pp. 064102-1-064102-8.
Kanno et al., "Measurement of transverse piezoelectric properties of PZT thin films", Sensors and Actuators A, vol. 107, 2003, pp. 68-74.
Muralt et al., "Excess Lead in the Perovskite Lattice of PZT thin Films made by in-situ Reactive Sputtering", Integrated Ferroelectrics, vol. 36, 2001, pp. 53-62.

* cited by examiner

*Primary Examiner* — Matthew Luu
*Assistant Examiner* — Lisa M Solomon
(74) *Attorney, Agent, or Firm* — Birch, Stewart, Kolasch & Birch, LLP

(57) ABSTRACT

A piezoelectric material of the invention includes a perovskite oxide (P) (which may contain inevitable impurities) represented by the formula below:

$$Pb_a(Zr_x, Ti_y, M_{b-x-y})_bO_c \qquad (P)$$

(wherein M represents one or two or more metal elements; wherein $0<x<b$, $0<y<b$, $0\leq b-x-y$; and wherein a molar ratio a:b:c is 1:1:3 as a standard; however, the molar ratio may be varied from the standard molar ratio within a range where a perovskite structure is obtained). The perovskite oxide (P) has a signal intensity ratio $I(Pb^{4+})/I(Pb^{2+})$ between $Pb^{4+}$ and $Pb^{2+}$ of not less than 0.60 measured through XAFS.

12 Claims, 8 Drawing Sheets

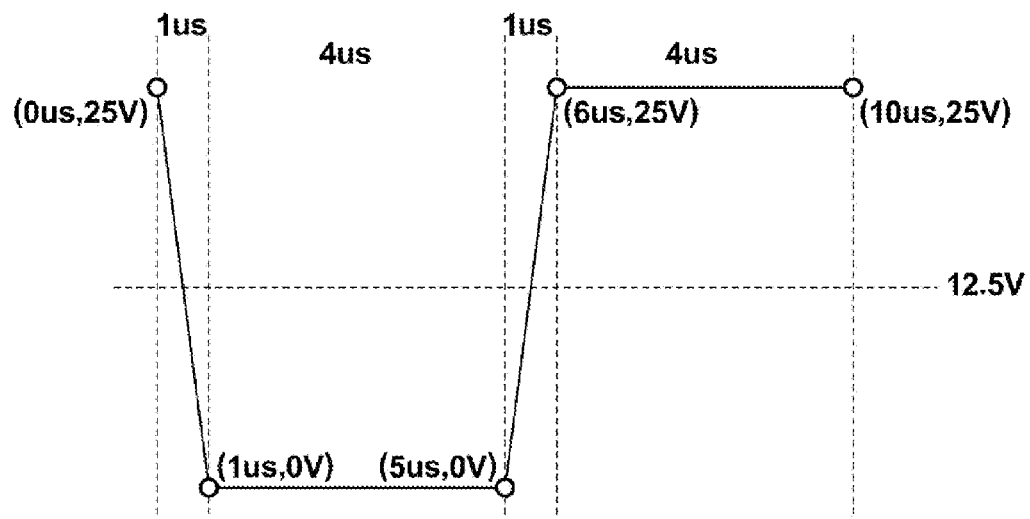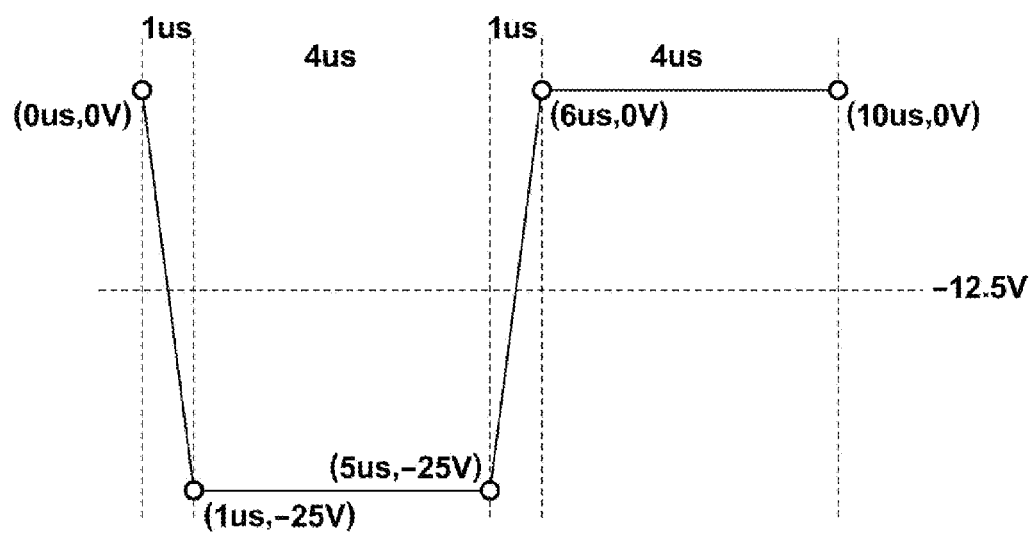
FIG.7

PIEZOELECTRIC MATERIAL, METHOD FOR PRODUCING PIEZOELECTRIC MATERIAL, PIEZOELECTRIC DEVICE AND LIQUID DISCHARGE DEVICE

BACKGROUND OF THE INVENTION

1. Field of the Invention

The present invention relates to a PZT piezoelectric material, a method for producing the PZT piezoelectric material, as well as a piezoelectric device and a liquid discharge device employing the PZT piezoelectric material.

2. Description of the Related Art

Piezoelectric devices, which include a piezoelectric material that expands or contracts when the intensity of an applied electric field is increased or decreased, and an electrode for applying the electric field to the piezoelectric material, are used in applications, such as piezoelectric actuators provided in inkjet recording heads. As piezoelectric materials, PZT (lead zirconium titanate) and substitution systems of PZT, which has a part of the A-site and/or B-site thereof being substituted with a different element, have been known. PZT and the substitution systems thereof are herein collectively referred to as the "PZT system" or "PZT".

It is known that PZT doped with a donor ion which has a higher valence than a valence of a substituted ion has higher piezoelectric performance than that of the intrinsic PZT. Examples of a donor ion that substitutes $Zr^{4+}$ and/or $Ti^{4+}$ at the B-site include $V^{5+}$, $Nb^{5+}$, $Ta^{5+}$, $Sb^{5+}$, $Mo^{6+}$ and $W^{6+}$. A PZT perovskite oxide with a part of the B-site thereof substituted with a different element M is represented by general formula (P) below:

(wherein M represents one or two or more B-site elements; wherein $0<x<b$, $0<y<b$, $0 \leqq b-x-y$; and wherein a molar ratio a:b:c is 1:1:3 as a standard; however, the molar ratio may be varied from the standard molar ratio within a range where a perovskite structure is obtained.)

In "Measurement of transverse piezoelectric properties of PZT thin films", I. Kanno et al., Sensors and Actuators A, Vol. 107, pp. 68-74, 2003 (which is hereinafter referred to as "non-patent document 1"), bipolar polarization-to-electric field characteristics of a c-axis oriented PZT film having tetragonal crystal structure are evaluated. FIG. 8A shows the polarization-to-electric field characteristics of the PZT film disclosed in FIG. 2 of non-patent document 1. In this film, the direction of the axis of spontaneous polarization coincides with the direction of the applied electric field. Thus, there occurs only 180° domain switching in the film and no 90° domain rotation. The polarization-to-electric field characteristics of this film have good cornered curves, that is, there are sharp polarization changes around coercive electric fields Ec1 and Ec2. The polarization changes around the coercive electric fields Ec1 and Ec2 occur due to the 180° domain switching.

In typical piezoelectric materials, non-180° domain rotation, such as the 90° domain rotation, occurs, and therefore the polarization changes around the coercive electric fields Ec1 and Ec2 are less sharp. Therefore, electric field-to-deformation characteristics thereof exhibits hysteresis. Further, in typical piezoelectric materials, the bipolar polarization-to-electric field curve is substantially point-symmetric with respect to the origin. Therefore, the absolute value of the coercive electric field Ec1 at the negative side of the electric field of the bipolar polarization-to-electric field curve substantially coincides with the coercive electric field Ec2 at the positive side of the electric field ($|Ec1| \approx Ec2$). FIG. 8B schematically shows a polarization-to-electric field curve of a typical piezoelectric material where non-180° domain rotation occurs.

Common piezoelectric materials are typically driven in a unipolar driving mode, i.e., within a range from the electric field of 0 to an electric field $E_{max}$ where the bipolar electric field-to-deformation curve exhibits the maximum displacement at the positive side of the electric field, or within a range from the electric field of 0 to an electric field $E_{min}$ where the bipolar electric field-to-deformation curve exhibits the minimum displacement at the negative side of the electric field.

In the common piezoelectric materials having the polarization-to-electric field characteristics shown in FIG. 8B, the two coercive electric fields Ec1 and Ec2 have different polarities. Therefore, the polarization switching occur during both of the unipolar driving with the positive voltage (driving within the range from the electric field of 0 to the electric field $E_{max}$ where the bipolar electric field-to-deformation curve exhibits the maximum displacement at the positive side of the electric field) and the unipolar driving with the negative voltage (driving within the range from the electric field of 0 to the electric field $E_{min}$ where the bipolar electric field-to-deformation curve exhibits the minimum displacement at the negative side of the electric field).

The polarization switching causes loss in the piezoelectric deformation, and thus power consumption for obtaining a desired piezoelectric deformation is increased. Therefore, it is desirable that no polarization switching occurs during the unipolar driving.

Japanese Unexamined Patent Publication No. 2003-243741 (which is hereinafter referred to as "patent document 1") proposes a piezoelectric film having asymmetric polarization-to-electric field hysteresis characteristics, where two coercive electric field points in the hysteresis characteristics are at the same polarity of the electric field of the polarization-to-electric field hysteresis characteristics curve (see claim 1). Patent document 1 discloses that the piezoelectric film having the above-described polarization-to-electric field hysteresis characteristics is provided by changing, for example, the amount of Zr in the film thickness direction (see claim 3).

SUMMARY OF THE INVENTION

In view of the above-described circumstances, the present invention is directed to providing a PZT piezoelectric material in which no polarization switching occurs during unipolar driving.

The piezoelectric material of the invention contains a perovskite oxide (P) (which may contain inevitable impurities) represented by the formula below:

(wherein M represents one or two or more metal elements; wherein $0<x<b$, $0<y<b$, $0 \leqq b-x-y$; and wherein a molar ratio a:b:c is 1:1:3 as a standard; however, the molar ratio may be varied from the standard molar ratio within a range where a perovskite structure is obtained), the piezoelectric material having a signal intensity ratio $I(Pb^{4+})/I(Pb^{2+})$ between $Pb^{4+}$ and $Pb^{2+}$ of not less than 0.60 measured through XAFS (X-ray absorption fine-structure spectroscopy).

According to the invention, a piezoelectric material can be provided, which has both the two coercive electric fields of the bipolar polarization-to-electric field hysteresis curve being at the positive side of the electric field of the bipolar polarization-to-electric field hysteresis curve.

The piezoelectric device of the invention includes the above-described piezoelectric material of the invention, and an electrode for applying an electric field to the piezoelectric material.

The liquid discharge device of the invention includes the above-described piezoelectric device of the invention, and a liquid discharge member disposed adjacent to the piezoelectric device, the liquid discharge member including a liquid reservoir for storing a liquid, and a liquid discharge port for discharging the liquid from the liquid reservoir to the outside in response to application of the electric field to the piezoelectric material.

According to the invention a PZT piezoelectric material in which no polarization switching occurs during unipolar driving can be provided.

BRIEF DESCRIPTION OF THE DRAWINGS

FIG. 7 is a diagram illustrating drive waveforms used in average life measurement.

DESCRIPTION OF THE PREFERRED EMBODIMENTS

Figure 1:
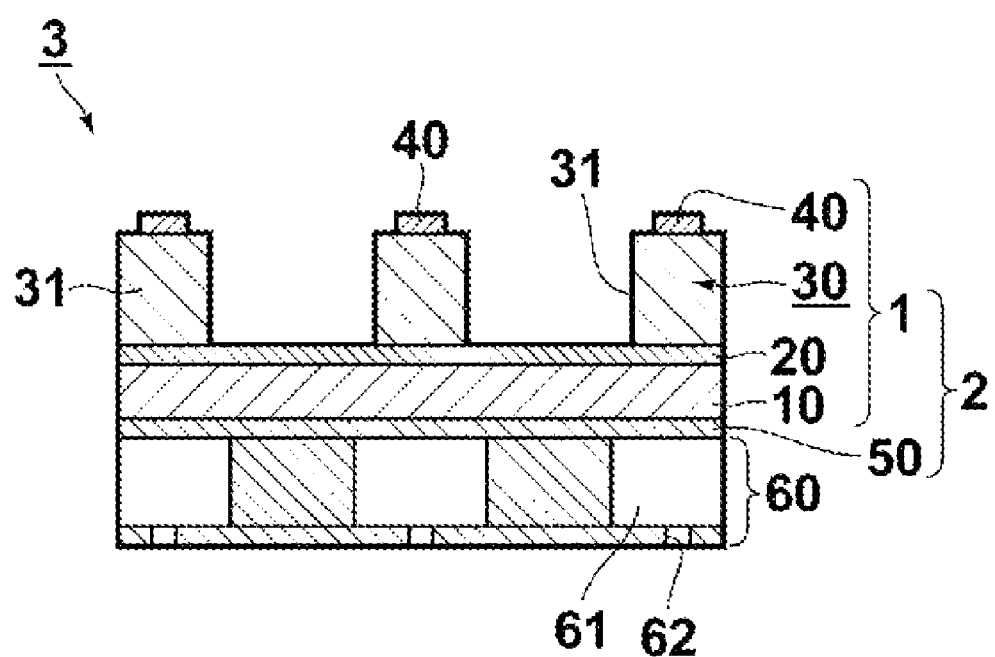
FIG. 1 is a sectional view illustrating the structure of a piezoelectric device and an inkjet recording head (liquid discharge device) according to one embodiment of the present invention.

With respect to PZT perovskite oxides, Pb has conventionally been considered to be divalent and be included at the A-site of the perovskite structure. Therefore, there has been no report of detailed analysis data of the valence of Pb in the PZT perovskite oxides.

As lead oxides, PbO, which is an oxide of divalent Pb, $Pb_3O_4$, which is an oxide of divalent Pb and tetravalent Pb, $PbO_2$, which is an oxide of tetravalent Pb, etc., are known, and it is known that the tetravalent Pb is metastable. However, the decomposition temperature of $Pb_3O_4$ is about 500° C., and the decomposition temperature of $PbO_2$ is about 290° C. Since the production temperature for the PZT perovskite oxides is usually higher than the decomposition temperature of the tetravalent Pb, it has been believed that the tetravalent Pb is not present in the perovskite oxides.

Recently, a hypothesis that the tetravalent Pb is present at the B-site has been presented in "Structural investigation of $Pb_y(Zr_{0.57}Ti_{0.43})_{2-y}O_3$ films deposited on Pt(001)/MgO(001) substrates by rf sputtering", T. Matsunaga et al., PHYSICAL REVIEW B, Vol. 66, 064102, pp. 064102-1-064102-8, 2002 and in "EXCESS LEAD IN THE PEROVSKITE LATTICE OF PZT THIN FILMS MADE BY IN-SITU REACTIVE SPUTTERING", P. Muralt et al., Integrated Ferroelectrics, Vol. 36, pp. 53-62, 2001.

The former document describes X-ray Rietveld analysis conducted on PZT films of non-MPB composition (Zr/Ti molar ratio =57/43, Pb/(Zr+Ti) molar ratio=1.07, 1.15, etc.), and states that it is structurally consistent if a tetravalent Pb is present at the B-site.

In the latter document, it is presumed that excessive Pb is included at the B-site as a tetravalent Pb since no segregation of PbO, or the like, is observed in TEM observation of a PZT film of non-MPB composition (Zr/Ti molar ratio=45/55, Pb/(Zr+Ti) molar ratio=1.30).

However, both of them are only presumptions. Further, both of them pertain to the PZTs of non-MPB composition, and do not report even presumption about the presence of the tetravalent Pb with respect to the MPB composition. Since the MPB composition has a complicated nano-structure, it is impossible to analyze the valence of Pb in PZT with the X-ray Rietveld analysis.

As described above, the presence of the tetravalent Pb in PZT has not conventionally been believed, and, even in the documents which mention the presence of the tetravalent Pb, it is only presumption. Under these circumstances, no research has been conducted about the relationship between the tetravalent Pb and properties of the piezoelectric material.

As shown in examples, which will be described later, the present inventors have proved the presence of the tetravalent Pb in the PZT perovskite oxides first in the world by conducting XAFS (X-ray absorption fine-structure spectroscopy). Further, the present inventors have found that a PZT piezoelectric material in which no polarization switching occurs during unipolar driving can be provided by making the amount of the tetravalent Pb within a certain range.

The present inventors have accomplished a PZT piezoelectric material which has both the two coercive electric fields of the bipolar polarization-to-electric field hysteresis curve being at the same polarity of the electric field of the bipolar polarization-to-electric field hysteresis curve.

Figure 6:
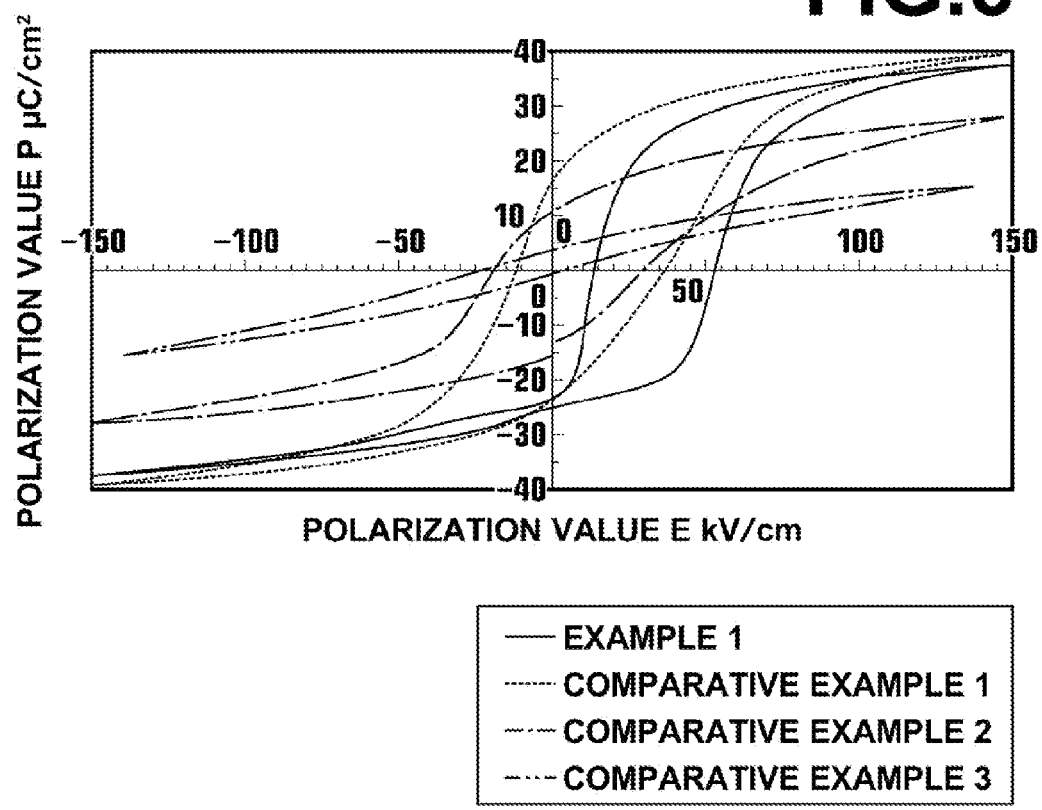
FIG. 6 shows bipolar polarization-to-electric field hysteresis curves of Example 1 and Comparative Example 1 to 3.
Figure 8A:
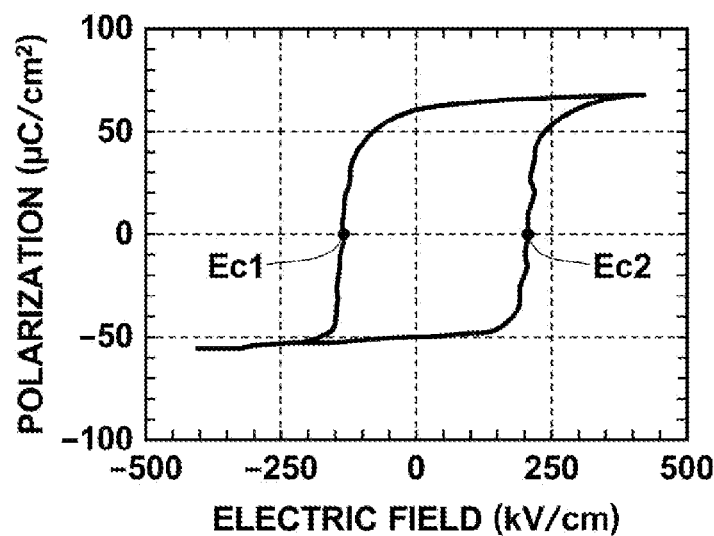
FIG. 8A shows a polarization-to-electric field curve of a PZT film disclosed in non-patent document 1.
Figure 8B:
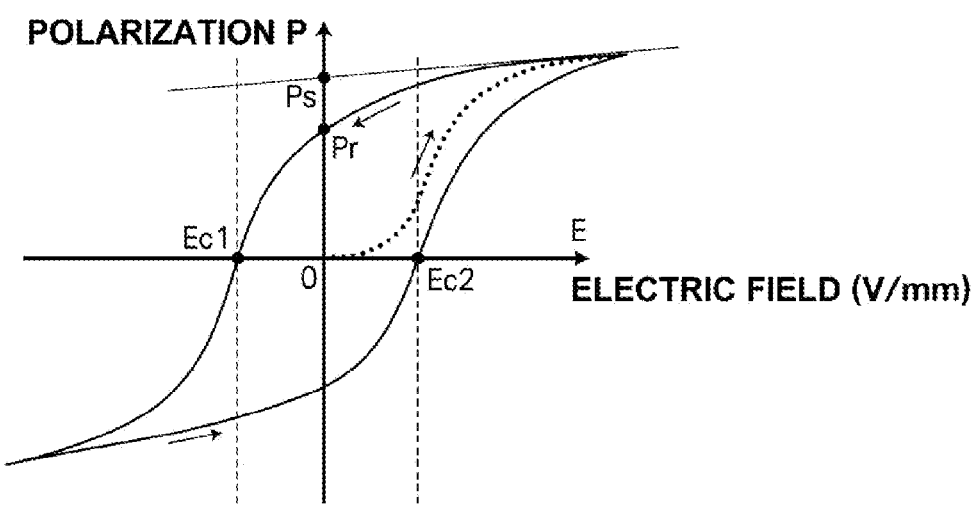
FIG. 8B shows a polarization-to-electric field curve of a conventional typical piezoelectric material in which non-180° domain rotation occurs.

The present inventors have accomplished a PZT piezoelectric material which has both the two coercive electric fields of the bipolar polarization-to-electric field hysteresis curve being at the positive side of the electric field of the bipolar polarization-to-electric field hysteresis curve (Example 1 shown in FIG. 6). In this piezoelectric material, no polarization switching occurs during unipolar driving with a negative voltage (driving within the range from the electric field of 0 to the electric field $E_{min}$ where the bipolar electric field-to-deformation curve exhibits the minimum displacement at the negative side of the electric field), and thus the piezoelectric material can be driven with a lower power consumption than those of conventional piezoelectric materials.

The piezoelectric material of the invention includes a perovskite oxide (which may contain inevitable impurities) represented by formula (P) below:

$$Pb_a(Zr_x, Ti_y, M_{b-x-y})_bO_c \qquad (P)$$

(wherein M represents one or two or more metal elements; wherein 0<x<b, 0<y<b, 0≦b−x−y; and wherein a molar ratio a:b:c is 1:1:3 as a standard; however, the molar ratio may be varied from the standard molar ratio within a range where a perovskite structure is obtained), wherein a signal intensity ratio $I(Pb^{4+})/I(Pb^{2+})$ between $Pb^{4+}$ and $Pb^{2+}$ measured through XAFS (X-ray absorption fine-structure spectroscopy) is not less than 0.60.

The perovskite oxide (P) is the intrinsic PZT or a PZT with a part of the B-site thereof substituted with M.

In the perovskite oxide (P), x and y are not particularly limited as long as the relationships $0<x<b$ and $0<y<b$ are satisfied.

It is said with respect to the PZT perovskite oxides that high piezoelectric performance is exhibited at and around the morphotropic phase boundary (MPB). When the PZT system is Zr-rich, a rhombohedral system is formed, when the PZT system is Ti-rich, a tetragonal system is formed, and the phase boundary between the rhombohedral system and the tetragonal system, i.e., the MPB, lies around Zr/Ti molar ratio=55/45.

Therefore, x and y of the perovskite oxide (P) may be or may be close to those of the MPB composition. Specifically, $x/(x+y)$ may be not less than 0.40 and not more than 0.60, or may optionally be not less than 0.45 and not more than 0.55.

M, which is one or two or more substitution elements at the B-site, is not particularly limited.

It is known that PZT doped with a donor ion which has a higher valence than a valence of a substituted ion has higher piezoelectric performance than that of the intrinsic PZT. M may be one or two or more donor ions having a valence higher than tetravalent Zr and/or Ti. Examples of such a donor ion include $V^{5+}$, $Nb^{5+}$, $Ta^{5+}$, $Sb^{5+}$, $Mo^{6+}$ and $W^{6+}$. That is, in the perovskite oxide (P), $0<b-x-y$, and M may include at least one element selected from the group consisting of V, Nb, Ta and Sb.

The value of $b-x-y$ is not particularly limited as long as a perovskite structure is obtained. For example, if M is Nb, the molar ratio of Nb/(Zr+Ti+Nb) may be not less than 0.05 and not more than 0.25, or may optionally be not less than 0.05 and not more than 0.20.

The present inventors have found that, when the ratio $I(Pb^{4+})/I(Pb^{2+})$ is not less than 0.60, both the two coercive electric fields of the bipolar polarization-to-electric field hysteresis curve are at the same polarity of the electric field of the bipolar polarization-to-electric field hysteresis curve, and no polarization switching occurs during the unipolar driving, and thus a piezoelectric material which can be driven with a lower power consumption can be provided.

The ratio $I(Pb^{4+})/I(Pb^{2+})$ is correlated with the ratio of the amounts of $Pb^{4+}$ and $Pb^{2+}$. Although it is not clearly supported, the present inventors presume that, since the valence of the tetravalent Pb is unusual, the tetravalent Pb may have an effect to hinder the polarization switching, that is, the polarization is controlled by a point defect due to the tetravalent Pb.

The ion radius of $Pb^{2+}$ is 1.63 angstrom, and the ion radius of $Pb^{4+}$ is 0.915 angstrom. The "ion radius" herein is Shannon's ion radius. Although it is not clearly supported, it is presumed from the ion radius that the $Pb^{2+}$ is included at the A-site and the $Pb^{4+}$ is included at the B-site.

In patent document 1 mentioned in the "Description of the Related Art" section, the asymmetric P-E hysteresis characteristics, in which both of the two coercive electric fields of the bipolar polarization-to-electric field hysteresis curve are at the same polarity of the electric field of the bipolar polarization-to-electric field hysteresis curve, is accomplished by changing the amount of Zr in the film thickness direction. This method requires changing the composition in the film thickness direction, and thus a complicated composition design is required to achieve desired polarization-to-electric field hysteresis characteristics. According to the invention, a desired polarization-to-electric field hysteresis can be provided in a stable manner by producing the piezoelectric material under the conditions where the ratio of $I(Pb^{4+})/I(Pb^{2+}) \geq 0.6$ is achieved, without changing the composition in the film thickness direction.

It is presumed that, in patent document 1, the polarization is controlled by changing the composition in the thickness direction to change the stress in the film thickness direction. Therefore, for a thicker film, a problem, such as crack, may occur. In contrast, in the invention, it is presumed that the polarization is controlled by the point defect due to the tetravalent Pb, and thus the piezoelectric material according the invention is less susceptible to the problem, such as crack, than the piezoelectric film of patent document 1.

The piezoelectric material may take any form, such as a single crystal, a bulk ceramic or a film. Considering providing thinner and smaller piezoelectric devices and productivity, etc., the piezoelectric material may take the form of a film, and may be a thin film with a thickness of not less than 500 nm and not more than 10 µm.

The substrate is not particularly limited, and any of a silicon substrate, a silicon oxide substrate and a SOI substrate may be preferred.

The ratio $I(Pb^{4+})/I(Pb^{2+})$ can be adjusted or controlled by controlling the production conditions, etc.

The process used to produce the piezoelectric film is not particularly limited, and examples thereof include gas phase processes such as sputtering, plasma CVD, MOCVD and PLD; liquid phase processes such as sol-gel method and organic metal decomposition method; and aerosol deposition process. Among them, the gas phase processes, such as sputtering, plasma CVD, MOCVD and PLD, may be preferred.

In the gas phase processes, the ratio $I(Pb^{4+})/I(Pb^{2+})$ can be adjusted by changing one or two or more factors involved in the film formation, such as film formation temperature and film formation pressure.

For example, the sputtering is a film formation method in which a substrate and a target are disposed to face each other, and a gas which is plasmized under reduced pressure is made to collide against the target, so that the energy of the collision makes molecules or atoms be ejected from the target and deposited on the substrate. In the sputtering, the ratio $I(Pb^{4+})/I(Pb^{2+})$ can be adjusted by changing one or two or more factors involved in the film formation, such as target composition, film formation temperature, substrate surface energy, film formation pressure, amount of oxygen in the atmosphere gas, plasma potential and substrate-target distance.

In sputtering, for example, even when targets having the same composition are used, a total Pb content and the ratio $I(Pb^{4+})/I(Pb^{2+})$ can be changed by changing the substrate temperature (see examples, which will be described later). The present inventors have found that, when the total Pb content in the perovskite oxide increases, the ratio of $Pb^{4+}$ tends to increase.

According to the invention, a PZT piezoelectric material with a piezoelectric constant $d_{31}$ of 150 pm/V or more can be provided (see Tables 1 and 2).

The piezoelectric constant $d_{31}$ measured under a sinusoidal voltage with an offset of 10 V, an amplitude of ±10 V and a frequency of 1 kHz is defined as $d_{31}(+)$. The piezoelectric constant $d_{31}$ measured under a sinusoidal voltage with an offset of −10 V, an amplitude of ±10V and a frequency of 1 kHz is defined as $d_{31}(-)$.

The "piezoelectric constant $d_{31}$ of 150 pm/V or more" herein means that at least one of the $d_{31}(+)$ and $d_{31}(-)$ defined above is 150 pm/V or more.

As described above, according to the invention, a PZT piezoelectric material can be provided, in which both the two coercive electric fields of the bipolar polarization-to-electric field hysteresis curve are at the same polarity of the electric field of the bipolar polarization-to-electric field hysteresis curve, and no polarization switching occurs during unipolar driving. According to the invention, a PZT piezoelectric material can be provided, in which no polarization switching occurs during unipolar driving, and thus which can be driven with lower power consumption.

Piezoelectric Device and Inkjet Recording Head

The structures of a piezoelectric device and an inkjet recording head (liquid discharge device) including the piezoelectric device according to one embodiment of the invention are described with reference to FIG. 1. FIG. 1 is a sectional view illustrating the main portion of the inkjet recording head (a sectional view taken along the thickness direction of the piezoelectric device). For ease of visual understanding, the components shown in the drawing are not to scale.

A piezoelectric device 1 of this embodiment includes a substrate 10, and a lower electrode 20, a piezoelectric film 30 and upper electrodes 40 which are sequentially formed on the substrate 10. An electric field in the thickness direction is applied to the piezoelectric film 30 via the lower electrode 20 and the upper electrodes 40.

The lower electrode 20 is formed over substantially the entire surface of the substrate 10. The piezoelectric film 30, which is formed by line-shaped protrusions 31 arranged in stripes pattern is formed on the lower electrode 20, and the upper electrodes 40 are formed on the individual protrusions 31.

The pattern of the piezoelectric film 30 is not limited to one shown in the drawing, and may be designed as appropriate. Alternatively, the piezoelectric film 30 may be a continuous film. However, when the piezoelectric film 30 is not a continuous film and has the pattern including the plurality of separate protrusions 31, the individual protrusions 31 can smoothly expand or contract, thereby providing larger displacement.

The substrate 10 is not particularly limited, and may be any of various substrates, such as silicon, silicon oxide, stainless steel (SUS), yttrium stabilized zirconia (YSZ), alumina, sapphire, SiC, and $SrTiO_3$. The substrate 10 may be a multilayer substrate, such as a SOI substrate including a $SiO_2$ film and a Si active layer formed on a silicon substrate. The invention is particularly effective in a case where any of a silicon, silicon oxide, or SOI substrate is used.

The composition of the lower electrode 20 is not particularly limited, and examples thereof may include a metal or a metal oxide, such as Au, Pt, Ir, $IrO_2$, $RuO_2$, $LaNiO_3$, and $SrRuO_3$, as well as combinations thereof. The composition of the upper electrodes 40 is not particularly limited, and examples thereof may include the example materials listed for the lower electrode 20, electrode materials commonly used in semiconductor processes, such as Al, Ta, Cr and Cu, and combinations thereof. The thicknesses of the lower electrode 20 and the upper electrodes 40 are not particularly limited; however, their thicknesses may be in the range from 50 to 500 nm.

The piezoelectric film 30 is formed of the perovskite oxide (P) (which may contain inevitable impurities), which is the piezoelectric film of the invention having the signal intensity ratio $I(Pb^{4+})/I(Pb^{2+})$ between $Pb^{4+}$ and $Pb^{2+}$ of not less than 0.60 measured through XAFS. The film thickness of the piezoelectric film 30 is not particularly limited, and may be in the range from 500 μm to 10 μm, for example.

A piezoelectric actuator 2 includes a vibrating plate 50, which vibrates along with expansion and contraction of the piezoelectric film 30, attached on the back side of the substrate 10 of the piezoelectric device 1. The piezoelectric actuator 2 also includes a controlling means (not shown), such as a driving circuit, for controlling drive of the piezoelectric device 1.

An inkjet recording head (liquid discharge device) 3 generally includes, at the back side of the piezoelectric actuator 2, an ink nozzle (liquid storing and discharging member) 60 including an ink chamber (liquid reservoir) 61 for storing ink and an ink discharge port (liquid discharge port) 62 through which the ink is discharged from the ink chamber 61 to the outside. There are a plurality of ink chambers 61 provided correspondingly to the number and pattern of the protrusions 31 of the piezoelectric film 30. In the inkjet recording head 3, the piezoelectric device 1 expands or contracts when the intensity of the electric field applied to the piezoelectric device 1 is increased or decreased, thereby controlling discharge of the ink from the ink chamber 61 and the amount of the discharged ink.

Instead of attaching the vibrating plate 50 and the ink nozzle 60 which are members separate from the substrate 10, parts of the substrate 10 may be machined to form the vibrating plate 50 and the ink nozzle 60. For example, if the substrate 10 is a multilayer substrate, such as a SOI substrate, the substrate 10 may be etched at the back side thereof to form the ink chamber 61, and then the substrate may be machined to form the vibrating plate 50 and the ink nozzle 60.

The structures of the piezoelectric device 1 and the inkjet recording head 3 of this embodiment are as described above. According to this embodiment, the piezoelectric device 1, which allows unipolar driving with lower power consumption, can be provided.

Inkjet Recording Device

Figure 2:
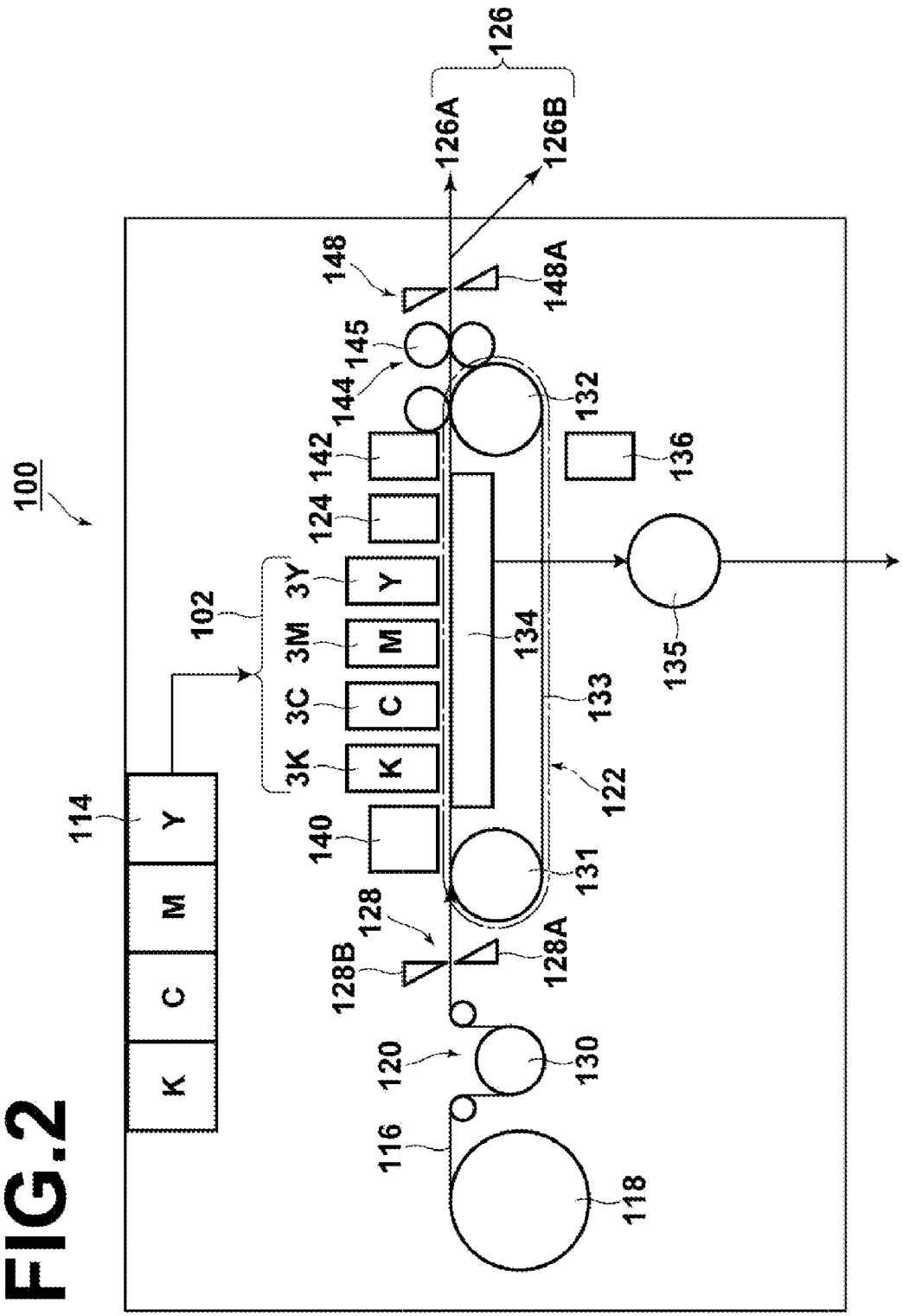
FIG. 2 is a diagram illustrating a configuration example of an inkjet recording device including the inkjet recording head shown in FIG. 1.
Figure 3:
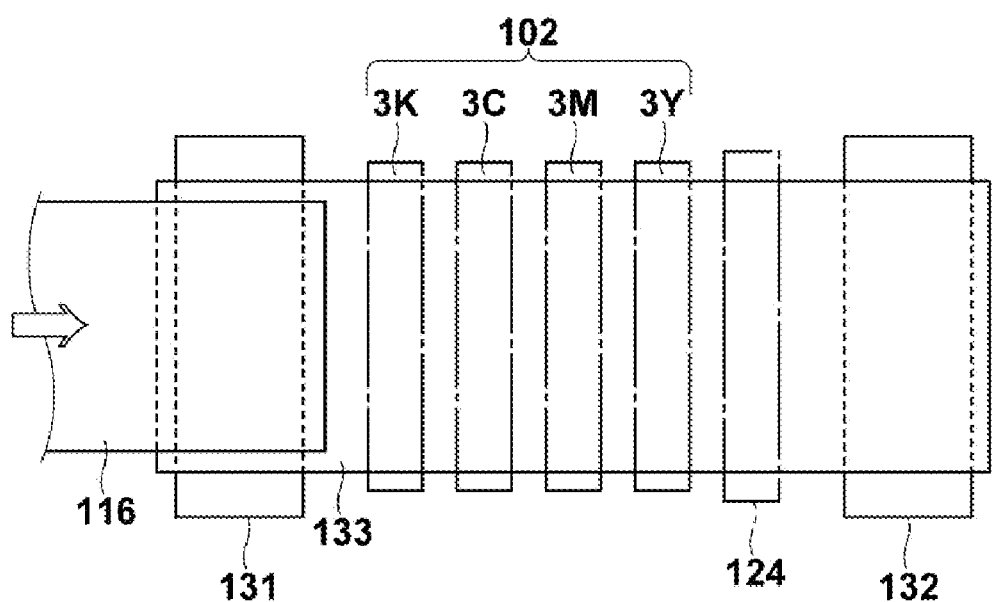
FIG. 3 is a partial plan view of the inkjet recording device shown in FIG. 2.

Now, an example configuration of an inkjet recording device including the inkjet recording head 3 of the above-described embodiment is described with reference to FIGS. 2 and 3. FIG. 2 shows the entire device configuration, and FIG. 3 is a partial plan view of the device.

An inkjet recording device 100 shown in the drawing generally includes: a printing section 102 having a plurality of inkjet recording heads (hereinafter simply referred to as "heads") 3K, 3C, 3M and 3Y provided correspondingly to ink colors; an ink storing and charging section 114 for storing inks to be fed to the heads 3K, 3C, 3M and 3Y; a paper feeding section 118 for feeding recording paper 116; a decurling section 120 for decurling the recording paper 116; a suction belt conveyer section 122 disposed to face to a nozzle surface (ink discharge surface) of the printing section 102, for conveying the recording paper 116 with keeping the flatness of the recording paper 116; a print detection section 124 for reading the result of printing at the printing section 102; and a paper discharge section 126 for discharging the printed recording paper (a print) to the outside.

Each of the heads 3K, 3C, 3M and 3Y forming the printing section 102 is the inkjet recording head 3 of the above-described embodiment.

At the decurling section 120, the recording paper 116 is decurled with a heating drum 130 heating the recording paper 116 in a direction opposite to the direction of the curl.

In the device using the roll paper, a cutter 128 is provided downstream the decurling section 120, as shown in FIG. 2, so that the roll paper is cut by the cutter into a sheet of a desired size. The cutter 128 is formed by a fixed blade 128A, which has a length equal to or larger than the width of the conveyance path for the recording paper 116, and a round blade 128B, which moves along the fixed blade 128A. The fixed blade 128A is disposed on the back surface side of the print, and the round blade 128B is disposed on the print surface side via the conveyance path. In a case where the device uses cut sheets, the cutter 128 is not necessary.

The decurled and cut recording paper sheet 116 is sent to the suction belt conveyer section 122. The suction belt conveyer section 122 includes an endless belt 133 wrapped around rollers 131 and 132, and is adapted such that at least an area of the belt facing the nozzle surface of the printing section 102 and a sensor surface of the print detection section 124 forms a horizontal (flat) surface.

The belt 133 has a width that is larger than the width of the recording paper sheet 116, and a number of suction holes (not shown) are formed in the belt surface. A suction chamber 134 is provided on the inner side of the belt 133 wrapped around the rollers 131 and 132 at a position where the suction chamber 134 faces to the nozzle surface of the printing section 102 and the sensor surface of the print detection section 124. A suction force generated by a fan 135 provides the suction chamber 134 with a negative pressure, thereby suctioning and holding the recording paper sheet 116 on the belt 133.

As a motive force from a motor (not shown) is transmitted to at least one of the rollers 131 and 132, around which the belt 133 is wrapped, the belt 133 is driven in the clockwise direction in FIG. 2, and the recording paper sheet 116 held on the belt 133 is conveyed from the left to the right in FIG. 2.

In a case where margin-less printing, or the like, is carried out, the inks adhere on the belt 133. Therefore, a belt cleaning section 136 is provided at a predetermined position (any appropriate position other than the print region) on the outer side of the belt 133.

A heating fan 140 is provided upstream the printing section 102 along the paper sheet conveyance path formed by the suction belt conveyer section 122. The heating fan 140 blows heating air onto the recording paper sheet 116 to heat the recording paper sheet 116 before printing. Heating the recording paper sheet 116 immediately before printing promotes drying of the deposited ink.

The printing section 102 is a so-called full-line head, in which line heads, each having a length corresponding to the maximum paper width, are arranged in a direction (main scanning direction) perpendicular to the paper feed direction (see FIG. 3). Each recording head 3K, 3C, 3M, 3Y is formed by a line head, which has a plurality of ink discharge orifices (nozzles) provided across a length that is larger than at least one side of the recording paper sheet 116 of the maximum size printable by the inkjet recording device 100.

The heads 3K, 3C, 3M and 3Y respectively corresponding to the color inks of black (K), cyan (C), magenta (M) and yellow (Y) are disposed in this order from the upstream along the feed direction of the recording paper sheet 116. By discharging the color inks from the heads 3K, 3C, 3M and 3Y while the recording paper sheet 116 is conveyed, a color image is recorded on the recording paper sheet 116.

The print detection section 124 is formed by a line sensor, or the like, which images the result of ink droplets deposited by the printing section 102, and the image of the deposited ink droplets read by the line sensor is used to detect discharge defects, such as clogging of the nozzles.

A drying section 142 formed, for example, by a heating fan for drying the printed image surface is disposed downstream the print detection section 124. Since contact with the printed surface should be avoided until the printed inks dry, blowing hot air may be preferred.

A heating and pressurizing section 144 for controlling the gloss of the image surface is disposed downstream the drying section 142. The heating and pressurizing section 144 presses the image surface with a pressure roller 145 having a predetermined textured pattern on the surface thereof while heating the image surface, thereby transferring the textured pattern onto the image surface.

The thus obtained print is discharged at the paper discharge section 126. Prints of intended images (prints on which intended images are printed) and test prints may separately be discharged. The inkjet recording device 100 includes a sorting means (not shown) for sorting the prints of intended images and the test prints and switching the discharge paths to selectively send them to a discharge section 126A or 126B.

In a case where an intended image and a test print are printed at the same time on a large-sized paper sheet, a cutter 148 may be provided to cut off the test print area.

The configuration of the inkjet recording device 100 is as described above.

Modification

The present invention is not limited to the above-described embodiments, and may be modified as appropriate without departing from the spirit and scope of the invention.

EXAMPLES

Now, an example according to the invention and comparative examples are described.

Example 1

A 20 nm-thick Ti film and a 150 nm-thick (111) Ir film forming the lower electrode were sequentially formed on a Si wafer through sputtering. Then, a Nb—PZT piezoelectric film was formed on the lower electrode. The substrate temperature was 420° C., and this temperature was maintained during the film formation. The total thickness of the Nb—PZT piezoelectric film was 4 µm. The film formation temperature conditions for forming the piezoelectric film are shown in Table 1.

Other film formation conditions for forming the piezoelectric film were as follows:

film formation device: a RF sputtering apparatus (FERROELECTRIC FILM FORMATION SPUTTERING APPARATUS, type MPS, available from ULVAK, Inc.), target: $Pb_{1.3}((Zr_{0.52}Ti_{0.48})_{0.88}Nb_{0.12})O_3$ sintered body with a diameter of 120 mm, film formation power: 500 W, substrate-target distance: 60 mm, film formation pressure: 0.3 Pa, and film formation gas: $Ar/O_2=97.5/2.5$ (molar ratio).

Finally, Ti/Pt upper electrodes (Ti: 20 nm-thick/Pt: 150 nm-thick) were formed on the PZT film through vapor deposition (the Ti layer serves as an adhesion layer and the Pt layer mainly serves as the electrode) to provide the piezoelectric device of the invention.

Comparative Example 1

A piezoelectric device was provided in the same manner as in Example 1, except that the film formation temperature conditions for forming the piezoelectric film were changed as shown in Table 1.

During the film formation of the piezoelectric film, an initial layer with a thickness of 150 nm was formed at a substrate temperature of 420° C., and then, the substrate temperature was changed to 450° C. to form a main layer. In the device used in this example, it took about 10 minutes for the substrate temperature to actually reach the set temperature after the set temperature was changed. The total thickness of the Nb—PZT piezoelectric film was 4 µm.

Comparative Examples 2 to 3

Piezoelectric devices were provided in the same manner as in Comparative Example 1, except that the film formation temperature conditions for forming the piezoelectric film were changed as shown in Table 1.

The composition was the MPB composition in all of Example 1 and Comparative Examples 1 to 3, and only the film formation temperature conditions for forming the piezoelectric film were changed to form films having different $I(Pb^{4+})/I(Pb^{2+})$ ratios.

Evaluation

<XRD>

XRD analysis using the θ/2θ measurement method was conducted on the piezoelectric films of Example 1 and Comparative Examples 1 to 3, using an X-ray diffractometer ULTIMA for thin film evaluation, available from Rigaku, Co., Ltd.

Figure 4:
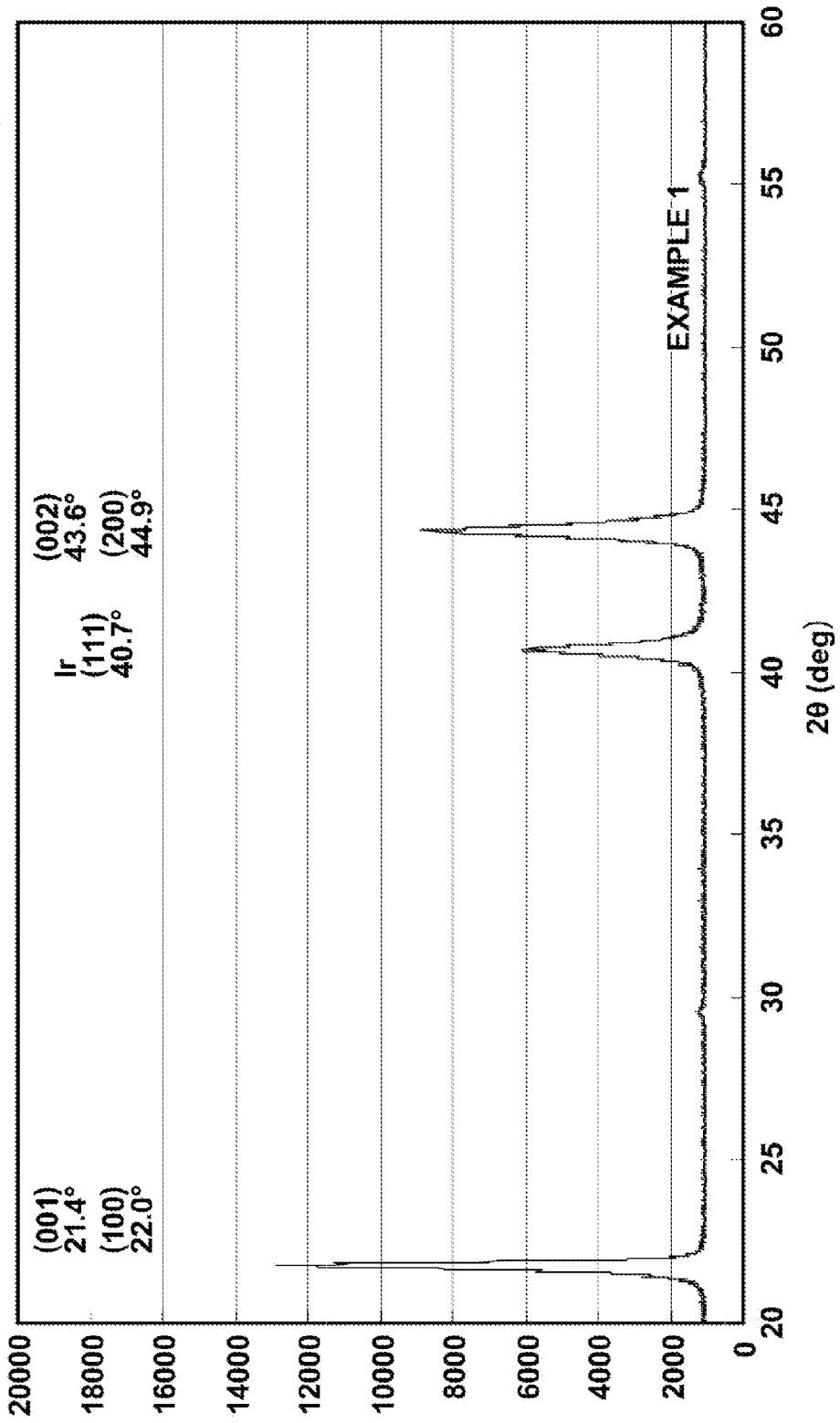
FIG. 4 is a graph showing an XRD pattern of a piezoelectric film of Example 1.

In all the examples, the resulting piezoelectric film was a (100)-oriented film having a perovskite structure. The degree of orientation F measured with the Lotgerling method was 99%. No peaks of different phases, such as the pyrochlore phase and PbO were observed, and thus the resulting piezoelectric films had a single-phase perovskite structure with good crystallinity. As a representative example, an XRD pattern of Example 1 is shown in FIG. 4.

<XRF>

X-ray fluorescence (XRF) measurement was conducted on the piezoelectric films of Example 1 and Comparative Examples 1 to 3, using an X-ray fluorescence device AXIOS, available from PANalytical, to measure the a/b ratio (=Pb/(Zr+Ti+Nb) molar ratio). The results are shown in Table 1.

<XAFS>

Figure 5:
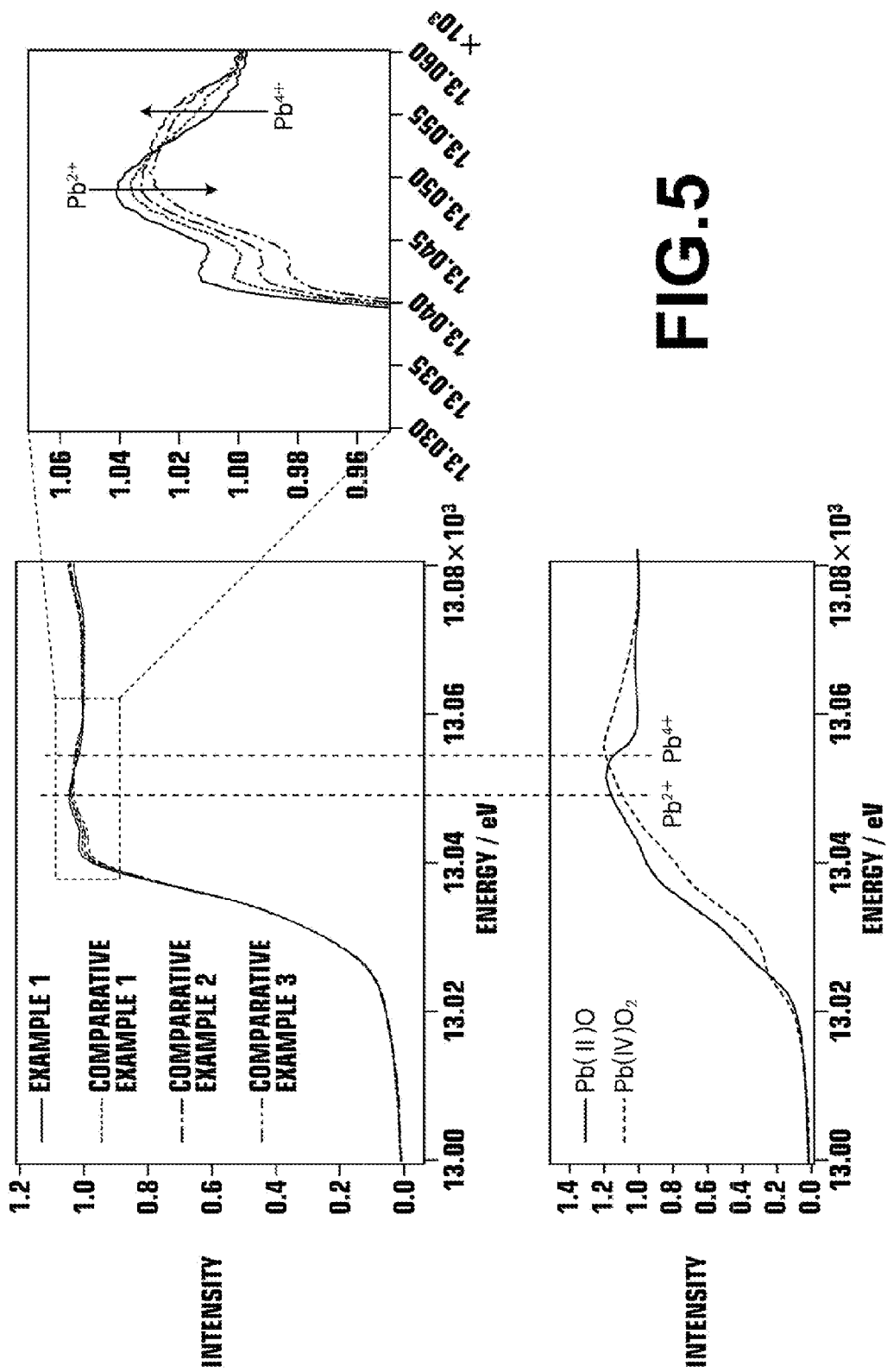
FIG. 5 is a graph showing XANES spectra of Example 1 and Comparative Examples 1 to 3.

XAFS measurement was conducted on the piezoelectric films of Example 1 and Comparative Examples 1 to 3, using the Spring-8, a synchrotron radiation facility, and at the High Energy Accelerator Research Organization. XANES spectra around the Pb L3 absorption edge are shown in FIG. 5.

Based on comparison with standard samples (Pb(II)O, Pb(IV)O$_2$), peaks observed at 13048 eV were determined as being derived from Pb$^{2+}$, and peaks observed at 13055 eV were determined as being derived from Pb$^{4+}$. The peak intensities $I(Pb^{2+})$ and $I(Pb^{4+})$ were found through fitting using a Gaussian function to calculate the ratio $I(Pb^{4+})/I(Pb^{2+})$. The results are shown in Table 1.

<Bipolar Polarization-To-Electric Field Hysteresis Curve>

Bipolar polarization-to-electric field hysteresis curves of the piezoelectric devices obtained in Example 1 and Comparative Examples 1 to 3 were measured using a FERROELECTRIC HYSTERESIS EVALUATION DEVICE FCE, available from TOYO Corporation. The results are shown in FIG. 6.

From the hysteresis curves shown in FIG. 6, a deviation D (%) of the hysteresis of each piezoelectric film was found. The results are shown in Table 2. The deviation D (%) of the hysteresis was calculated according to the equation below:

$$D(\%) = (Ec2 + Ec1)/(Ec2 - Ec1) \times 100,$$

wherein Ec1 and Ec2 are coercive electric fields and Ec1<Ec2.

The piezoelectric device of Example 1 having the ratio $I(Pb^{4+})/I(Pb^{2+})$ being not less than 0.60 exhibited a polarization-to-electric field hysteresis characteristics where D (%)>100 and both of the two coercive electric fields Ec1 and Ec2 were at the positive side of the electric field of the polarization-to-electric field hysteresis characteristics curve.

TABLE 1

| | Film Formation Temperature for Initial Layer (Thickness of Initial Layer) | Film Formation Temperature for Main Layer | a/b | $I(Pb^{4+})/I(Pb^{2+})$ |
|---|---|---|---|---|
| Ex. 1 | 420° C. | | 1.12 | 0.64 |
| Comp. Ex. 1 | 420° C. (150 nm) | 450° C. | 1.06 | 0.58 |
| Comp. Ex. 2 | 420° C. (150 nm) | 480° C. | 1.02 | 0.46 |
| Comp. Ex. 3 | 420° C. (150 nm) | 510° C. | 0.97 | 0.28 |

TABLE 2

| | $I(Pb^{4+})/I(Pb^{2+})$ | $d_{31}(+)$ (pm/V) | $d_{31}(-)$ (pm/V) | Deviation of P-E hysteresis D (%) |
|---|---|---|---|---|
| Ex. 1 | 0.64 | 10 | 250 | 170 |
| Comp. Ex. 1 | 0.58 | 50 | 240 | 59 |
| Comp. Ex. 2 | 0.46 | 190 | 200 | −22 |
| Comp. Ex. 3 | 0.28 | 210 | 60 | −95 |

Industrial Applicability

The piezoelectric material and the method for producing the piezoelectric material of the invention is preferably applicable to piezoelectric actuators provided in inkjet recording heads, magnetic read/write heads, MEMS (Micro Electro-Mechanical Systems) devices, micropumps, ultrasound probes, ultrasound motors, etc., and ferroelectric devices, such as ferroelectric memory.

What is claimed is:

1. A piezoelectric material comprising a perovskite oxide (P) (which may contain inevitable impurities) represented by the formula below:

$$Pb_a(Zr_x, Ti_y, M_{b-x-y})_b O_c \qquad (P)$$

(wherein M represents one or two or more metal elements; wherein 0<x<b, 0<y<b, 0≦b−x−y; and wherein a molar ratio a:b:c is 1:1:3 as a standard; however, the molar ratio may be varied from the standard molar ratio within a range where a perovskite structure is obtained), the piezoelectric material having a signal intensity ratio $I(Pb^{4+})/I(Pb^{2+})$ between Pb$^{4+}$ and Pb$^{2+}$ of not less than 0.60 measured through XAFS (X-ray absorption fine-structure spectroscopy).

2. The piezoelectric material as claimed in claim 1, wherein x/(x+y) of the perovskite oxide (P) is not less than 0.40 and not more than 0.60.

3. The piezoelectric material as claimed in claim 1, wherein, in the perovskite oxide (P), 0<b−x−y and M comprises at least one element selected from the group consisting of V, Nb, Ta and Sb.

4. The piezoelectric material as claimed in claim 3, wherein the perovskite oxide (P) comprises Nb, and a Nb/(Zr+Ti+Nb) molar ratio is not less than 0.05 and not more than 0.25.

5. The piezoelectric material as claimed in claim 1 having a piezoelectric constant $d_{31}$ of 150 pm/V or more.

6. The piezoelectric material as claimed in claim 1 in the form of a film.

7. The piezoelectric material as claimed in claim 6, wherein the film has a thickness of not less than 500 nm and not more than 10 μm.

8. The piezoelectric material as claimed in claim 6 formed with a gas phase film formation process.

9. The piezoelectric material as claimed in claim 6 formed on any one of a silicon substrate, a silicon oxide substrate and a SOI substrate.

10. The piezoelectric material as claimed in claim 1, wherein both two coercive electric fields of a bipolar polarization-to-electric field hysteresis curve are at a positive side of the electric field of the bipolar polarization-to-electric field hysteresis curve.

11. A piezoelectric device comprising:
the piezoelectric material as claimed in claim 1; and
an electrode for applying an electric field to the piezoelectric material.

12. A liquid discharge device comprising:
the piezoelectric device as claimed in claim 11; and
a liquid discharge member disposed adjacent to the piezoelectric device, the liquid discharge member comprising a liquid reservoir for storing a liquid, and a liquid discharge port for discharging the liquid from the liquid reservoir to the outside in response to application of the electric field to the piezoelectric material.

* * * * *